US011173562B2

(12) United States Patent
Yang

(10) Patent No.: US 11,173,562 B2
(45) Date of Patent: Nov. 16, 2021

(54) SOLDER PASTE FEEDING ASSEMBLY AND METHOD

(71) Applicant: Illinois Tool Works Inc., Glenview, IL (US)

(72) Inventor: Ning Yang, Suzhou (CN)

(73) Assignee: Illinois Tool Works Inc., Glenview, IL (US)

( * ) Notice: Subject to any disclaimer, the term of this patent is extended or adjusted under 35 U.S.C. 154(b) by 189 days.

(21) Appl. No.: 16/604,472

(22) PCT Filed: Apr. 13, 2018

(86) PCT No.: PCT/IB2018/000451
§ 371 (c)(1),
(2) Date: Oct. 10, 2019

(87) PCT Pub. No.: WO2018/189586
PCT Pub. Date: Oct. 18, 2018

(65) Prior Publication Data
US 2021/0129248 A1 May 6, 2021

(30) Foreign Application Priority Data

Apr. 14, 2017 (CN) .......................... 201710245230.8
Apr. 14, 2017 (CN) .......................... 201720395604.X

(51) Int. Cl.
*B23K 1/00* (2006.01)
*B23K 3/06* (2006.01)
(Continued)

(52) U.S. Cl.
CPC .......... *B23K 3/0623* (2013.01); *B23K 1/0016* (2013.01); *B23K 3/0638* (2013.01);
(Continued)

(58) Field of Classification Search
CPC .... B23K 3/0638; B23K 3/087; B23K 35/025; B05C 11/101; B05C 17/014;
(Continued)

(56) References Cited

U.S. PATENT DOCUMENTS 4,932,581 A * 6/1990 Ohle ..................... B23K 3/0615
226/43
4,942,984 A * 7/1990 Miller ................... B05C 5/0225
222/309
(Continued)

FOREIGN PATENT DOCUMENTS

| CN | 1500561 A | 6/2004 |
|---|---|---|
| CN | 102271919 A | 12/2011 |

(Continued)

OTHER PUBLICATIONS

Intenrational Search Report and Written Opinion from corresponding PCT/IB2018/000451 dated Oct. 9, 2018.
(Continued)

*Primary Examiner* — Kiley S Stoner
(74) *Attorney, Agent, or Firm* — Lando & Anastasi, LLP

(57) ABSTRACT

The present application provides a method for providing solder paste, for providing solder paste accommodated in a solder paste tub into a solder paste printer, the method comprising: inserting a solder paste nozzle into a housing of the solder paste tub through an opening of the solder paste tub, wherein solder paste is accommodated in the housing of the solder paste tub; bearing the solder paste tub, with the opening facing downward, on a working platform by means of the solder paste nozzle; holding the solder paste tub by mating a holder with an engagement means on an outer wall of the housing of the solder paste tub, the holder being capable of moving up and down with the housing of the solder paste tub; and pressing the housing of the solder paste tub, such that the housing of the solder paste tub moves
(Continued)

relative to the solder paste nozzle, at the same time causing the holder to move as the housing of the solder paste tub moves, so as to extrude solder paste accommodated in the housing of the solder paste tub from the solder paste nozzle.

8 Claims, 8 Drawing Sheets

(51) Int. Cl.
  *H05K 3/34* (2006.01)
  *H05K 3/12* (2006.01)
  *B23K 101/42* (2006.01)
(52) U.S. Cl.
  CPC ......... *H05K 3/1233* (2013.01); *H05K 3/3485* (2020.08); *B23K 2101/42* (2018.08)
(58) Field of Classification Search
  CPC ................ B05C 5/0225; H05K 3/3485; H05K 2203/0126; H05K 13/0469
  USPC ................................. 228/248.1–248.5, 33, 41
  See application file for complete search history.

(56) References Cited

U.S. PATENT DOCUMENTS

| | | | | |
|---|---|---|---|---|
| 5,137,181 A * | 8/1992 | Keller | ............... | B05C 17/00553 222/134 |
| 5,558,504 A * | 9/1996 | Stridsberg | ............ | H05K 3/3485 417/322 |
| 6,082,289 A * | 7/2000 | Cavallaro | .......... | H05K 13/0469 118/243 |
| 6,267,266 B1 * | 7/2001 | Smith | ................. | B05C 11/1034 222/1 |
| 6,736,291 B1 * | 5/2004 | Mimura | ............... | H05K 3/1233 222/129 |
| 2004/0118935 A1 * | 6/2004 | Holm | .................... | B23K 3/0607 239/1 |
| 2004/0217193 A1 | 11/2004 | Holm et al. | | |
| 2009/0321394 A1 * | 12/2009 | Matsushita | .......... | B23K 3/0638 219/121.64 |
| 2010/0156970 A1 * | 6/2010 | Ikushima | ............... | B41J 25/308 347/8 |
| 2012/0138664 A1 * | 6/2012 | Sumioka | .............. | H05K 3/1233 228/102 |
| 2013/0334290 A1 * | 12/2013 | Lee | ...................... | B23K 3/0623 228/102 |
| 2014/0117067 A1 | 5/2014 | Sato | | |
| 2014/0150929 A1 * | 6/2014 | Sandstrom | ........... | B23K 35/362 148/24 |
| 2014/0217127 A1 * | 8/2014 | Ikushima | ............. | H05K 3/1241 222/420 |
| 2015/0367626 A1 * | 12/2015 | Mantani | .................. | B41F 15/44 101/123 |
| 2017/0055351 A1 * | 2/2017 | Kato | .................... | H05K 3/3478 |
| 2018/0117903 A1 * | 5/2018 | Mariano | ................. | B41F 15/26 |
| 2019/0174633 A1 * | 6/2019 | Mattero | .............. | B41F 15/0818 |

FOREIGN PATENT DOCUMENTS

| | | |
|---|---|---|
| CN | 105873709 A | 8/2016 |
| EP | 3078442 A1 | 10/2016 |
| TW | 200835558 A | 9/2008 |
| TW | 201642983 A | 12/2016 |
| WO | WO-2013088605 A1 * 6/2013 | ............. B41F 15/40 |

OTHER PUBLICATIONS

Taiwan Search Report from corresponding Taiwan Patent Application No. 107112761 dated Aug. 5, 2021.

* cited by examiner

SOLDER PASTE FEEDING ASSEMBLY AND METHOD

CROSS-REFERENCE TO RELATED APPLICATIONS

This application is a U.S. National Phase Application under 35 U.S.C. § 371 of International Application No. PCT/IB2018/000451, filed Apr. 13, 2018, which claims priority to Chinese Application No. 201710245230.8, filed Apr. 14, 2017 and Chinese Application No. 201720395604.X, filed Apr. 14, 2017. Each application referenced above is hereby incorporated by reference in its entirety for all purposes.

TECHNICAL FIELD

The present invention relates to an assembly for providing solder paste and a method thereof, in particular to an assembly for providing solder paste, and a method thereof, for a solder paste printer used in printed circuit board surface sealing/affixing technology.

BACKGROUND ART

In a printed circuit board surface sealing/affixing process, a solder paste printer (also called a stencil printer) is used to print solder paste onto an electronic product. (such as a circuit board). A solder paste printer generally comprises mechanisms such as a stencil (also called a template), a solder paste addition apparatus, and a scraper or squeegee. During printing, the circuit board is automatically fed into the solder paste printer; the circuit board has a pattern of solder pads or some other type of conductive surfaces on which solder paste can be deposited, and the circuit board also has one or more small holes or marks called datum points, which are used as reference points to align the circuit board with the stencil in the solder paste printer before solder paste is printed on the circuit board. Once the circuit board has been aligned with the stencil in the printer, solder paste is distributed by moving the scraper or squeegee in a skimming action over the stencil so as to force solder paste through holes in the stencil down onto the circuit board. After the printing operation, the circuit board is sent to another workstation in a printed circuit board processing production line.

An automatic solder paste addition apparatus on the solder paste printer is used to automatically add solder paste packed in a tub or tube to the stencil of the solder paste printer, and thereby replenish solder paste consumed during printing. A solder paste tub generally forms a solder paste tub assembly together with a solder paste nozzle, which is inserted into the solder paste tub through an opening of the solder paste tub; solder paste is distributed (or extruded) from the solder paste tub by relative displacement of the solder paste tub and the solder paste nozzle. When the automatic solder paste addition apparatus is used, first of all the solder paste tub assembly is mounted on the automatic solder paste addition apparatus, such that the opening of the solder paste tub faces downward; the solder paste tub assembly is then moved to a given position above the stencil (this action is abbreviated as "positioning"), then solder paste is distributed onto the stencil from the solder paste tub nozzle by an action such as extrusion or extraction (this action is abbreviated as "solder addition"). The two actions of positioning and solder addition are generally driven by two independent drive components respectively (e.g. a push rod cylinder, rotary cylinder, electric machine, etc.). An automatic solder paste addition apparatus having two drive components makes a control system and a mechanical structure of the solder paste printer complicated; moreover, a large space is occupied, and costs are high.

In addition, after the action such as extrusion or extraction has been performed to distribute solder paste onto the stencil from the solder paste tub nozzle, there will generally be residual solder paste left at a nozzle mouth of the solder paste tub nozzle after the solder addition action ends, due to the solder paste's own weight and the viscosity of the solder paste. For this reason, in existing automatic solder paste addition apparatuses, a tray for receiving dripping residual solder paste is generally added close to the nozzle mouth of the solder paste tub nozzle, and the tray is then cleaned periodically. The need for an operator to clean the tray increases personnel maintenance costs.

CONTENT OF THE INVENTION

An object of the present application is to provide an assembly for providing solder paste, which utilizes a limiting flange on a solder paste tub housing to provide solder paste to an automatic solder paste addition apparatus, while being able to prevent dripping of solder paste due to its own weight.

According to a first aspect of the present application, the present application provides d method for providing solder paste, for providing solder paste accommodated in a solder paste tub into a solder paste printer, the method comprising: inserting a solder paste nozzle into a housing of the solder paste tub through an opening of the solder paste tub, wherein solder paste is accommodated in the housing of the solder paste tub; bearing the solder paste tub, with the opening facing downward, on a working platform by means of the solder paste nozzle; holding the solder paste tub by mating a holder with an engagement means on an outer wall of the housing of the solder paste tub, the holder being capable of moving up and down with the housing of the solder paste tub; and pressing the housing of the solder paste tub, such that the housing of the solder paste tub moves relative to the solder paste nozzle, at the same time causing the holder to move as the housing of the solder paste tub moves, so as to extrude solder paste accommodated in the housing of the solder paste tub from the solder paste nozzle.

The method for providing solder paste according to the first aspect, wherein a limiting flange on the housing of the solder paste tub, used for mating with a lid of the solder paste tub to seal the solder paste tub, is used as the engagement means.

The method for providing solder paste according to the first aspect, wherein before the solder paste nozzle is inserted into the housing of the solder paste tub through the opening of the solder paste tub, the lid of the solder paste tub is removed from the opening of the solder paste tub, to expose the opening of the solder paste tub.

The method for providing solder paste according to the first aspect, wherein a height adjustment apparatus enables the holder to move up and down with the housing of the solder paste tub.

The method for providing solder paste according to the first aspect, wherein the height adjustment apparatus comprises a flat spiral spring, with the elasticity of the flat spiral spring being configured to be matched to the weight of solder paste accommodated in the solder paste tub.

According to a second aspect of the present application, the present application provides an assembly for providing solder paste, comprising: a solder paste tub having a housing, with an engagement means being provided on an outer wall of the housing; a holder, the holder being engaged with the housing of the solder paste tub by means of the engagement means, and thereby holding the solder paste tub; the holder is slidably connected to a working platform support apparatus of an automatic solder paste addition apparatus, a working platform for bearing the solder paste tub is mounted on the working platform support apparatus, and the holder is located above the working platform.

The assembly for providing solder paste according to the second aspect, wherein the solder paste tub has an opening, the solder paste tub accommodates solder paste and a solder paste nozzle by means of the opening, the solder paste nozzle is mounted on the working platform so that the solder paste tub is borne, with the opening facing downward, on the working platform by means of the solder paste nozzle, and the housing can move relative to the solder paste nozzle, so as to extrude solder paste accommodated in the solder paste tub from the solder paste nozzle.

The assembly for providing solder paste according to the second aspect, further comprising a height adjustment apparatus, with one end of the height adjustment apparatus being connected to the holder, and another end of the height adjustment apparatus being connected to the working platform support apparatus, for the purpose of adjusting the height of the holder relative to the working platform support apparatus.

The assembly for providing solder paste according to the second aspect, wherein the height adjustment apparatus is a flat spiral spring, with a free end of the flat spiral spring being connected to the holder, and a spiral roll part of the flat spiral spring being mounted on the working platform support apparatus; and the elasticity of the flat spiral spring is configured to be matched to the weight of solder paste accommodated in the solder paste tub.

The assembly for providing solder paste according to the second aspect, wherein the engagement means is a limiting flange extending along a circumference of the outer wall of the housing.

The assembly for providing solder paste according to the second aspect, wherein the holder comprises a through-hole, with the size of the through-hole matching an outer diameter of the housing of the solder paste tub; and an edge of the through-hole of the holder is engaged below the engagement means.

The assembly for providing solder paste according to the second aspect, wherein the holder comprises a slider located on one side thereof, the working platform support apparatus comprises a slide groove located on one side thereof, and the slider fits the slide groove, so as to slidably connect the holder to the working platform support apparatus.

The method and assembly for providing solder paste of the present application utilize the limiting flange on the solder paste tub housing, in particular the mating between the limiting flange on the solder paste tub housing and the holder, to provide solder paste to an automatic solder paste addition apparatus while being able to prevent dripping of solder paste due to its own weight, and can thereby increase the utilization rate of solder paste and save costs; at the same time, solder paste can be prevented from dripping in unnecessary positions, to increase the production efficiency of products.

DESCRIPTION OF THE ACCOMPANYING DRAWINGS

When the following detailed explanation is read with reference to the accompanying drawings, these and other features, aspects and advantages of the present application will become easier to understand. Throughout the drawings, identical reference labels represent identical components, wherein.

PARTICULAR EMBODIMENTS

Figure 1A:
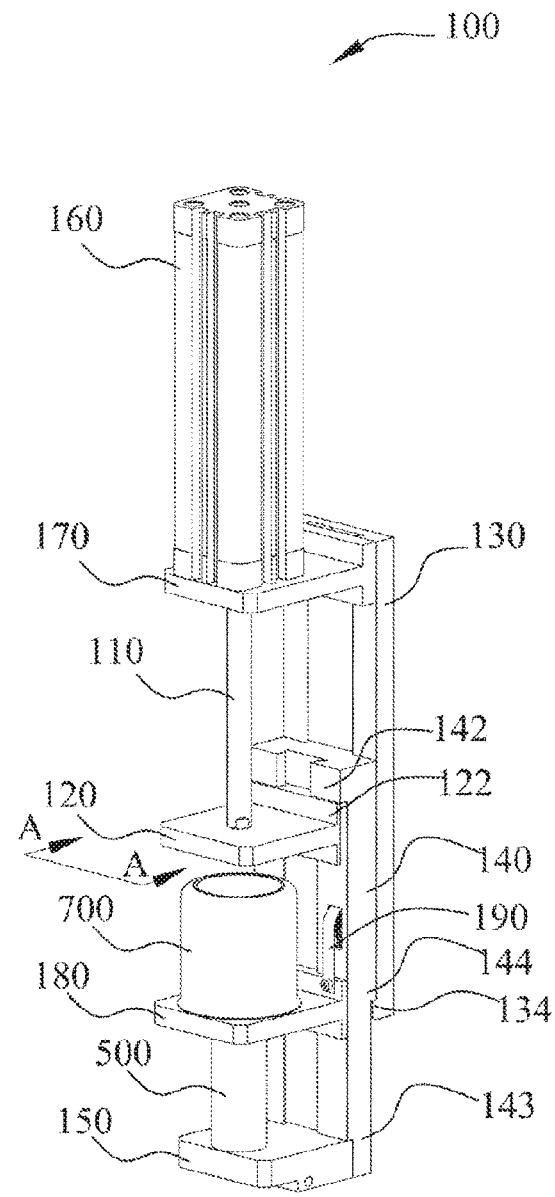
FIGS. 1A and 1B show a three-dimensional view and an exploded view respectively of an automatic solder paste addition apparatus of the present application.

Various particular embodiments of the present application are described below with reference to the accompanying drawings, which form part of this Description. It should be understood that although terms indicating direction such as "front", "rear", "up", "down", "left", "right", "inner" and "outer" are used in the present application to describe various demonstrative structural parts and elements of the present application, these terms are used here merely in order to facilitate explanation, and are determined on the basis of demonstrative directions shown in the drawings. Since the embodiments disclosed in the present application may be arranged according to different directions, these terms indicating direction serve merely as an explanation, and should not be regarded as a restriction. In possible cases, identical or similar reference labels used in the present application denote identical components.

Figure 1B:
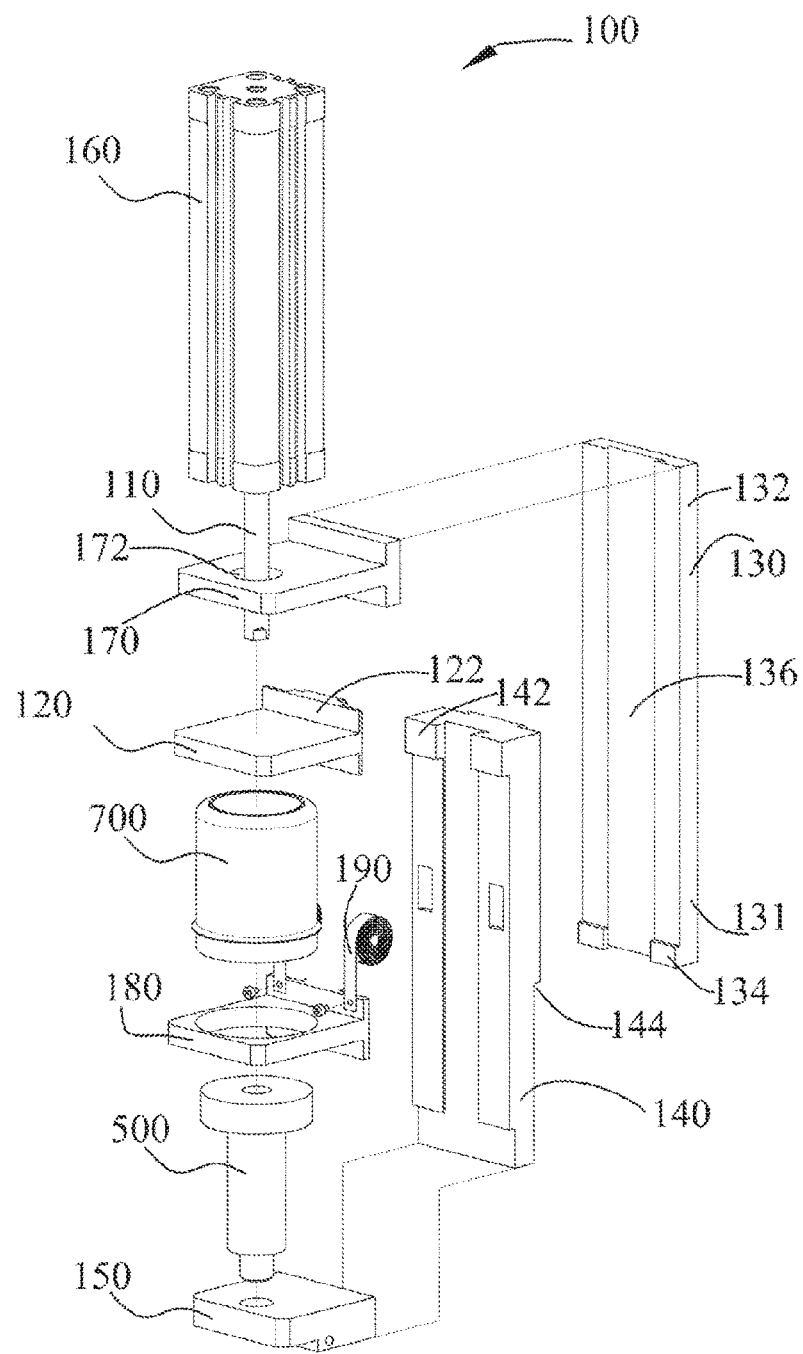

FIGS. 1A and 1B show a three-dimensional view and an exploded view respectively of an automatic solder paste addition apparatus 100 of the present application. As shown in FIGS. 1A and 1B, the automatic solder paste addition apparatus 100 comprises a support plate 130, a push rod 110, a pressure plate 120, a movable plate 140 and a working platform 150. The support plate 130 is mounted on a solder paste printer (not shown), and used to support the automatic solder paste addition apparatus 100. The pressure plate 120 is provided at an end of the push rod 110; the push rod 110 can be driven by a drive apparatus 160 to move up and down, thereby driving the pressure plate 120 to move up and down therewith. The support plate 130 is fixed in relation to the upward and downward movement of the push rod 110. The working platform 150 is fixed to the movable plate 140 on an inner side 141 of the movable plate 140, e.g. fixed to a lower end 143 of the movable plate 140. An outer side 145 of the movable plate 140 is disposed on the support plate 130 so as to be capable of sliding up and down, so that the movable plate 140 can slide up and down relative to the support plate 130, thereby driving the working platform 150 to ascend and descend. When the movable plate 140 slides down to a lower stopping point, the movable plate 140 reaches a working position thereof. The working platform 150 is used for bearing a solder paste tub 700 and a solder paste nozzle 500 accommodated in the solder paste tub 700. When the movable plate 140 reaches the working position thereof, the working platform 150 descends to a required height above a stencil of the printer (i. e. line L shown in FIG. 5), realizing positioning of the solder paste tub 700 in the height direction. The pressure plate 120 is disposed on the inner side 141 of the movable plate 140 so as to be capable of sliding up and down.

The drive apparatus 160 of the push rod 110 may be a cylinder or an electric machine, etc. The drive apparatus 160 may be mounted, as the support plate 130 is, on the solder paste printer, or mounted on the support plate 130, so that the positions of the drive apparatus 160 and the support plate 130 remain fixed relative to each other. The mounting of the drive apparatus 160 on the support plate 130 may be realized by means of a transverse mounting plate 170; a hole 172 for the push rod 110 to extend through is provided on the transverse mounting plate 170.

Still as shown in FIGS. 1A and 1B, a lower one-way locking mechanism 144, 134 is provided between the movable plate 140 and the support plate 130. The lower one-way locking mechanism 144, 134 defines the lower stopping point of upward and downward movement of the movable plate 140, and locks the movable plate 140 when the movable plate 140 is in the working position, so that the movable plate 140 cannot continue to move downward. Moreover, an upper locking mechanism 142, 122 is provided between the movable plate 140 and the pressure plate 120; the upper locking mechanism 142, 122 is configured so that the pressure plate 120 can move relative to the movable plate 140 when the movable plate 140 is not moving, and can also move together with the movable plate 140 when the movable plate 140 is moving. More specifically, the upper locking mechanism 142, 122 is configured so that the pressure plate 120 can drive the movable plate 140 to move together therewith in order to move the movable plate 140 to the working position or away from the working position, and so that the pressure plate 120 can move up and down relative to the movable plate 140 when the movable plate 140 is locked in the working position. As a result of providing the upper locking mechanism 142, 122 and the lower one-way locking mechanism 144, 134, the positioning action of moving the solder paste tub 700 and the solder paste nozzle 500 to the required height above the stencil, and the solder addition action of distributing solder paste onto the stencil from the solder paste tub nozzle, can be realized using just one drive apparatus 160.

The upper locking mechanism 142, 122 and the lower one-way locking mechanism 144, 134 are presented in detail below with reference to FIGS. 2A, 2B, 3A and 3B.

Figures 2A, 2B:
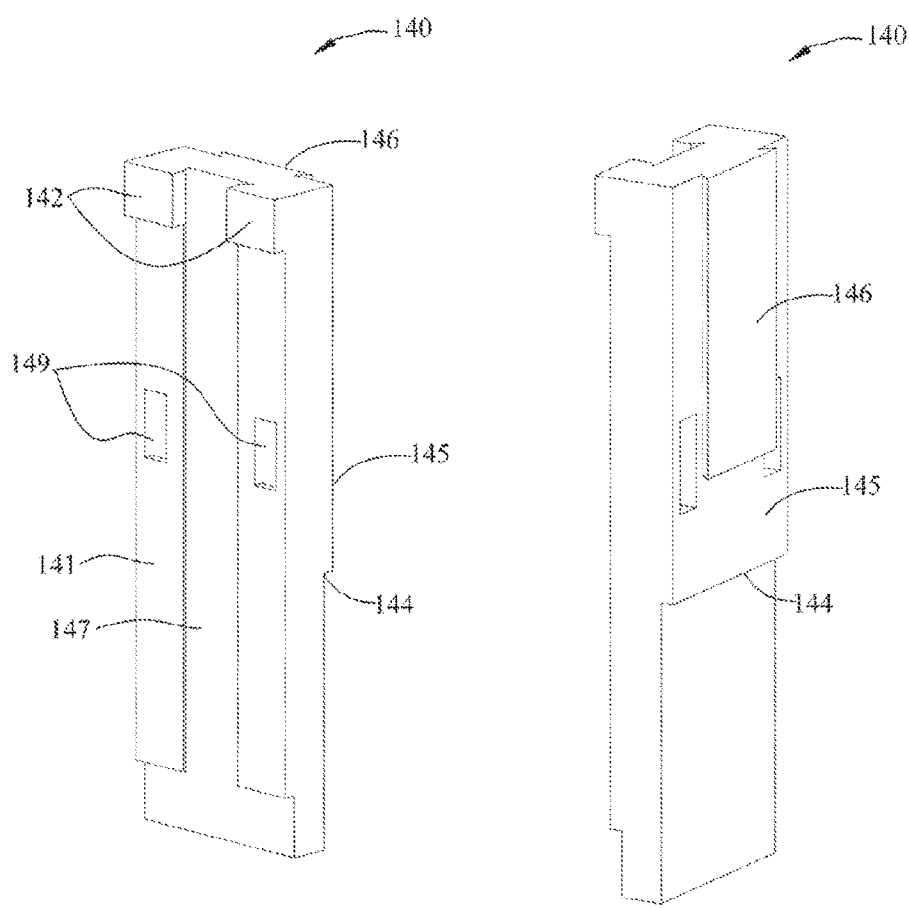
FIGS. 2A and 2B show inside and outside three-dimensional views respectively of a movable plate of the present application.

FIGS. 2A and 2B show inside and outside three-dimensional views respectively of the movable plate 140 of the present application. Referring to FIGS. 1A, 1B, 2A and 2B, the lower one-way locking mechanism 144, 134 comprises a blocking protruding edge 134 disposed at a lower end 131 of the support plate 130, and a blocked protruding edge 144 disposed on an outer side 145 (see FIG. 2A) of the movable plate 140; the blocking protruding edge 134 is located below the blocked protruding edge 144, and has a part which forms an overlap with the blocked protruding edge 144. Thus, when the movable plate 140 moves downward relative to the support plate 130 until the blocked protruding edge 144 of the movable plate 140 abuts the blocking protruding edge 134 of the support plate 130, the support plate 130 prevents the movable plate 140 from continuing to move downward, thereby locking the movable plate 140 in the working position.

As an example, the blocking protruding edge 134 and the blocked protruding edge 144 are formed by protrusions extending outward from the support plate 130 and the movable plate 140 respectively. The blocked protruding edge 144 may be disposed in a middle part or at an upper end of the outer side 145 of the movable plate 140; the position of the blocked protruding edge 144 on the outer side 145 of the movable plate 140 depends on a predetermined ascent/descent distance of the working platform 150.

Figures 3A, 3B:
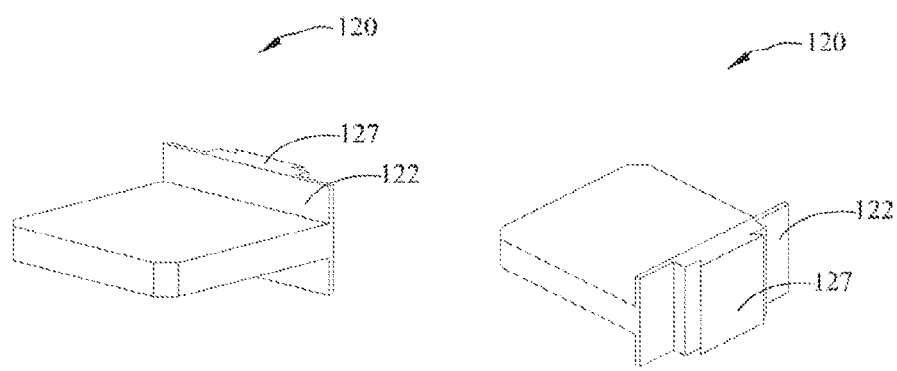
FIGS. 3A and 3B show inside and outside three-dimensional views respectively of a pressure plate of the present application.

FIGS. 3A and 3B show inside and outside three-dimensional views respectively of the pressure plate 120 of the present application. Referring to FIGS. 1A, 1B, 3A and 3B, the upper locking mechanism 142, 122 comprises a pulling edge 122 disposed on the pressure plate 120 and a force-bearing protruding edge 142 disposed on the inner side 141 of the movable plate 140; the pulling edge 122 is located below the force-bearing protruding edge 142, and has a part which forms an overlap with the force-bearing protruding edge 142. Thus, since the force-bearing protruding edge 142 of the movable plate 140 abuts the pulling edge 122 of the pressure plate 120, both downward and upward movement of the movable plate 140 relative to the support plate 130 can be controlled by movement of the pressure plate 120. Moreover, when the movable plate 140 is locked in the working position thereof by the lower one-way locking mechanism 144, 134, continued downward movement of the pressure plate 120 will cause the pulling edge 122 thereof to separate from the force-bearing protruding edge 142 of the movable plate 140, thereby releasing the movable plate 140. Thereafter, the pressure plate 120 can move downward relative to the movable plate 140, to press the solder paste tub 700, and perform a working process of solder addition.

Specifically, when the push rod 110 has not yet been driven by the drive apparatus 160 to move downward, the pressure plate 120 is fixed by the push rod 110 in an initial position thereof. At this time, since the force-bearing protruding edge 142 of the movable plate 140 abuts the pulling edge 122 of the pressure plate 120, the movable plate 140 is fixed and immobilized by the pressure plate 120. Only when the drive apparatus 160 begins to drive the push rod 110 to move downward, can the movable plate 140 move downward together with the pressure plate 120, until the working position of the movable plate 140 is reached. When the movable plate 140 is locked by the lower one-way locking mechanism 144, 134 in the working position thereof, the pressure plate 120 can move downward relative to the movable plate 140, to perform the working process of solder addition. After the working process of solder addition ends, when the movable plate 140 needs to be moved away from the working position thereof, moving the pressure plate 120 upward until the pulling edge 122 thereof abuts the force-bearing protruding edge 142 of the movable plate 140 enables the pressure plate 120 to be used to drive the movable plate 140 to move upward.

As an example, the force-bearing protruding edge 142 is formed by a protrusion extending outward from the movable plate 140, and the pulling edge 122 is an inside edge of the pressure plate 120. The force-bearing protruding edge 142 may be disposed at an upper end of the inner side 141 of the movable plate 140.

As shown in FIG. 1B, the support plate 130 has a first slide groove 136 extending between an upper end 132 and the lower end 131 thereof. As shown in FIG. 2B, the movable plate 140 has a first slider 146 disposed on the outer side 145 thereof. The first slider 146 and the first slide groove 136 fit each other, so as to connect the movable plate 140 to the support plate 130 in such a way that the movable plate can slide up and down. As an example, the first slider 146 and the first slide groove 136 both have trapezoidal cross sections, and have matching dimensions, such that the first slider 146 can be inserted into the first slide groove 136 from upper and lower ends of the first slide groove 136, and can slide up and down along the first slide groove 136 without being released from the first slide groove 136 in a direction transverse to the first slide groove 136.

As shown in FIG. 2A, the inner side 141 of the movable plate 140 is provided with a second slide groove 147 extending between the upper end and lower end thereof. As shown in FIG. 3B, the pressure plate 120 has a second slider 127 on the pulling edge 122 thereof. The second slider 127 and the second slide groove 147 fit together, so as to connect the pressure plate 120 to the inner side 141 of the movable plate 140 in such a way that the pressure plate can slide up and down. As an example, the second slider 127 and the second slide groove 147 both have trapezoidal cross sections, and have matching dimensions, such that the second slider 127 can be inserted into the second slide groove 147 from upper and lower ends of the second slide groove 147, and can slide up and down along the second slide groove 147 without being released from the second slide groove 147 in a direction transverse to the second slide groove 147.

Figure 4:
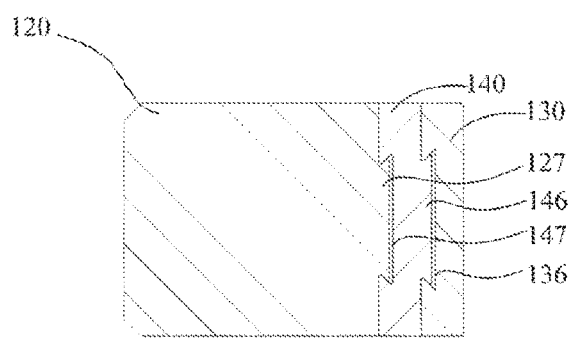
FIG. 4 shows a sectional view along line AA in FIG. 1A.

FIG. 4 shows a sectional view along line A-A in FIG. 1A. FIG. 4 shows cross sections of the first slider 146, the first slide groove 136, the second slider 127 and the second slide groove 147, and shows the fitting relationships between the second slider 127 of the pressure plate 120 and the second slide groove 147 of the movable plate 140, and between the first slider 146 of the movable plate 140 and the first slide groove 1:36 of the support plate 130.

As shown in FIG. 31, the thickness of the pressure plate 120 at the pulling edge 122 thereof is greater than the thickness of the remaining region of the pressure plate 120. The purpose of such a design is to enable the thickness of the second slider 127 at the pulling edge 122 to be greater, so that the sliding of the pressure plate 120 relative to the movable plate 140 is steadier.

Figure 5:
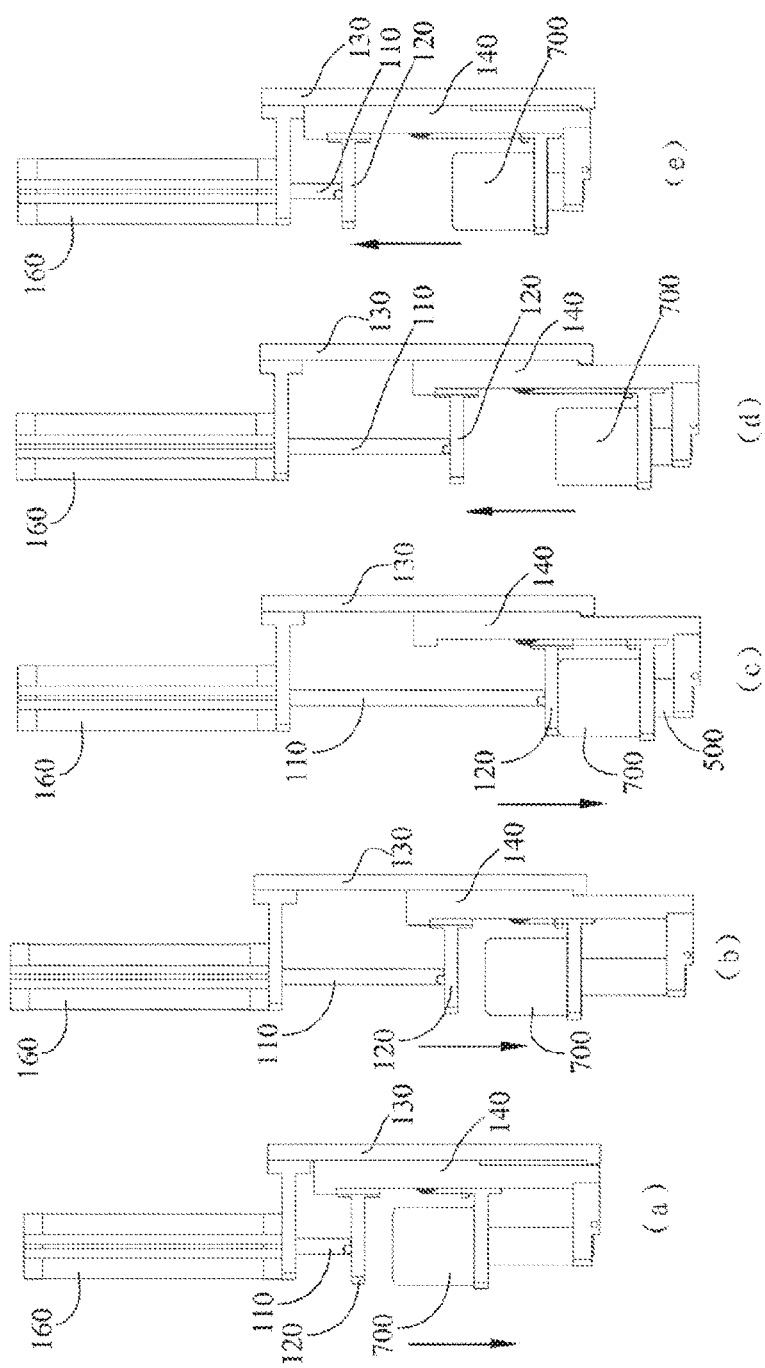
FIG. 5 shows one working cycle of an automatic solder paste addition apparatus of the present application.

FIG. 5 shows one working cycle of the automatic solder paste addition apparatus 100 of the present application, wherein line L represents the stencil of the solder paste printer, the automatic solder paste addition apparatus 100 is used to distribute solder paste from inside the solder paste tub 700 onto the stencil L, and FIGS. 5(a)-(e) show in an explanatory manner the changes in position, in the up/down direction (i. e. the height direction), of the movable plate 140 and the pressure plate 120 relative to the stencil L in one working cycle of the automatic solder paste addition apparatus 100 (i. e. the strokes of the movable plate 140 and the pressure plate 120). One working cycle of the automatic solder paste addition apparatus 100 comprises the positioning process of moving the solder paste tub 700 in the height direction from an initial position to the working position, the working process of solder addition (hereinafter abbreviated as "working process"), and a process of returning the solder paste tub 700 from the working position to the initial position in the height direction. It must be explained that FIGS. 5(a)-(e) do not signify that the automatic solder paste addition apparatus 100 moves left or right relative to the stencil L in the working cycle; the automatic solder paste addition apparatus 100 may move relative to the stencil L in one working cycle, or be fixed and immobilized relative to the stencil L. As an example, the automatic solder paste addition apparatus 100 moves linearly in a horizontal direction relative to the stencil L in the working process of solder addition, so as to distribute solder paste on the stencil L along a straight line or a curved line, beginning at a starting position requiring solder paste addition and continuing until an end position requiring solder paste addition on the stencil L is reached. In the positioning process of moving the solder paste tub 700 in the height direction from the initial position to the working position, and in the process of returning the solder paste tub 700 from the working position to the initial position in the height direction, the automatic solder paste addition apparatus 100 may or may not move in a horizontal direction relative to the stencil L. As an example, the automatic solder paste addition apparatus 100 has a parking position in the printer; before starting the working cycle of the automatic solder paste addition apparatus 100, it is necessary to first move the automatic solder paste addition apparatus 100 from the parking position to the starting position requiring solder paste addition on the stencil L, and after completing a solder addition process, it is necessary to move the automatic solder paste addition apparatus 100 from the end position requiring solder paste addition on the stencil L back to the parking position. As an example, the positioning process of moving the solder paste tub 700 in the height direction from the initial position to the working position may take place during the process of moving the automatic solder paste addition apparatus 100 from the parking position to the starting position requiring solder paste addition on the stencil L, and the process of returning the solder paste tub 700 from the working position to the initial position in the height direction may take place during the process of moving the automatic solder paste addition apparatus 100 from the end position requiring solder paste addition on the stencil L to the parking position.

In one working cycle of the automatic solder paste addition apparatus 100, the pressure plate 120 and the movable plate 140 have the following strokes: (i) a stroke of joint downward movement towards the working position of the movable plate 140; (ii) a stroke of relative downward movement after the working position of the movable plate 140 has been reached; (iii) a stroke of relative upward movement after the working process has ended; (iv) a stroke of joint upward movement. The stroke (i) of joint downward movement towards the working position of the movable plate 140 realizes the positioning process of moving the solder paste tub 700 in the height direction from the initial position to the working position; the stroke (ii) of relative downward movement after the working position of the movable plate 140 has been reached realizes the working process of solder addition; the stroke (iii) of relative upward movement after the working process has ended and the stroke (iv) of joint upward movement realize the process of returning the solder paste tub 700 from the working position to the initial position in the height direction.

FIG. 5(a) shows the initial position of the pressure plate 120 and the movable plate 140, in which position the drive apparatus 160 has not yet begun to drive the push rod 110 to move downward, therefore the pressure plate 120 is fixed and immobilized by the push rod 110, and the movable plate 140 is locked by the pressure plate 120 via the upper locking mechanism 142, 122 and cannot move downward. In FIG. 5(b), the movable plate 140 has just moved downward to the working position thereof; at this time, the movable plate 140 is locked by the lower one-way locking mechanism 144, 134 and cannot continue to move downward. The stroke from FIG. 5(a) to FIG. 5(b) is just the stroke of joint movement of the pressure plate 120 and the movable plate 140 downward towards the working position. In this stroke, the upper locking mechanism 142, 122 still locks the movable plate 140, such that the movable plate 140 cannot move freely downward, but can move downward as the push rod 110 and the pressure plate 120 move downward. Thus, as the drive apparatus 160 drives the push rod 110 to move downward, the movable plate 140 and the pressure plate 120 move downward together, along with the push rod 110. The end of this stroke signifies the end of the positioning process of the solder paste tub 700; the solder paste tub 700 is positioned at the required height above the stencil L.

FIG. 5(c) shows the pressure plate 120 pressing the solder paste tub 700. The stroke from FIG. 5(b) to FIG. 5(c) is just the stroke of relative downward movement after the working position of the movable plate 140 has been reached. In this stroke, the movable plate 140 is locked by the lower one-way locking mechanism 144, 134 and cannot continue to move downward, but the upper locking mechanism 142, 122 releases the movable plate 140, such that the pressure plate 120 can move downward relative to the movable plate 140. When the pressure plate 120 moves relative to the movable plate 140 into contact with the solder paste tub 700, the working process of solder addition begins, and continued downward movement of the pressure plate 120 will press the solder paste tub 700, such that the solder paste tub 700 and the nozzle 500 mounted on the working platform 150 and accommodated in the solder paste tub 700 experience relative movement, thereby distributing solder paste accommodated in the solder paste tub 700 onto the stencil L below from the nozzle 500. The end of this stroke signifies that the pressure plate 120 has completed the solder addition action, and the working process ends.

FIG. 5(d) shows the rising of the pressure plate 120 to such a position that the upper locking mechanism 142, 122 locks the movable plate 140 again, after the working process has ended; the locking at this time is for the purpose of moving the movable plate 140 upward back to the initial position thereof by means of the pressure plate 120 (as shown in FIG. 5(e)). The stroke from FIG. 5(c) to FIG. 5(d) is just the stroke of relative upward movement of the pressure plate 120 and the movable plate 140, after the working process has ended. In this stroke, the upper locking mechanism 142, 122 still releases the movable plate 142, and the pressure plate 120 moves upward relative to the movable plate 140, until the pulling edge 122 of the pressure plate 120 abuts the force-bearing protruding edge 142 of the movable plate 140.

FIG. 5(e) shows upward movement of the movable plate 130 back to the initial position thereof. The stroke from FIG. 5(d) to FIG. 5(e) is just the stroke of joint upward movement of the pressure plate 120 and the movable plate 140. In this stroke, the upper locking mechanism 142, 122 locks the movable plate 140, such that the movable plate 140 moves upward as the push rod 110 moves upward. The end of this stroke signifies the return of the pressure plate 120 and the movable plate 140 to the initial position thereof, and one working cycle of the automatic solder paste addition apparatus 100 ends.

Due to the use of the above-described support plate 130, movable plate 140 and pressure plate 120 which fit each other, the automatic solder paste addition apparatus 100 of the present application can realize the positioning action of moving the solder paste tub 700 to the required height above the stencil, and the solder addition action of distributing solder paste onto the stencil from the solder paste tub nozzle 500, using just one drive apparatus 160. Thus, the automatic solder paste addition apparatus 100 of the present application has a simple mechanical structure and a simple control system, does not occupy a large amount of space, and has low costs.

Figures 7A, 7B:
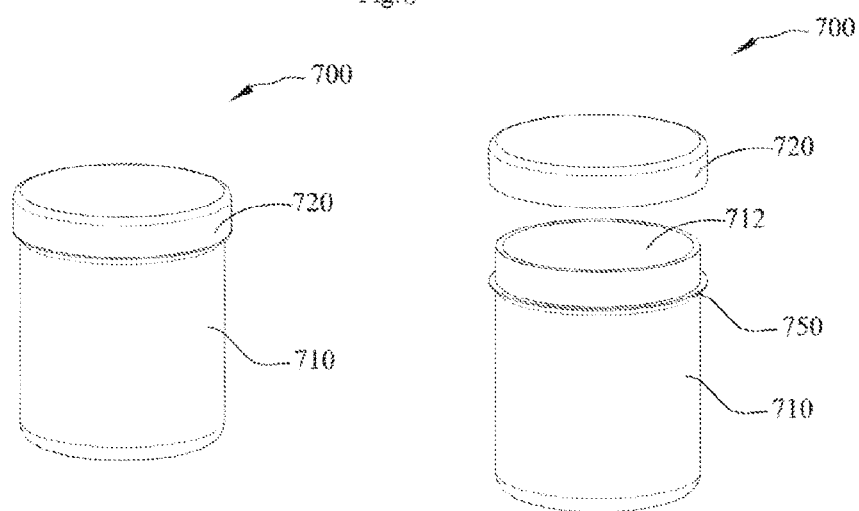
FIGS. 7A and 7B show a three-dimensional view and an exploded view respectively of a solder paste tub of the present application.

FIGS. 1A and 1B are now referred to again. As shown in FIGS. 1A and 1B, the present application also provides an apparatus for preventing solder paste dripping, for use in the automatic solder paste addition apparatus 100, and the present application also provides the solder paste tub 700 for use in cooperation with the apparatus for preventing solder paste dripping. Solder paste is a fluid of high viscosity, hence the solder paste accommodated in the solder paste tub 700 and a housing (710) of the solder paste tub 700 (as shown in FIG. 7A) stick together, and the solder paste has a certain weight. When the solder paste tub 700 is mounted, with an opening thereof facing downward, on the working platform 150 by means of the solder paste nozzle 500, the weight of the solder paste will cause the solder paste to have the tendency to flow out of the solder paste nozzle 500, even if the pressure plate 120 is not pressing the solder paste tub 700. Moreover, since the solder paste and the housing 710 of the solder paste tub 700 stick together, the weight of the solder paste drives the solder paste tub 700 to move downward relative to the nozzle 500 accommodated in the solder paste tub 700, but the downward movement of the solder paste tub 700 relative to the nozzle 500 will extrude solder paste from the solder paste tub 700, and this aggravates the tendency of the solder paste to flow out of the nozzle 500. For this reason, the present application provides the apparatus for preventing solder paste dripping and the solder paste tub 700 for use in cooperation with the apparatus for preventing solder paste dripping, in order to prevent solder paste from dripping due to its own weight from the solder paste nozzle 500.

Figure 6:
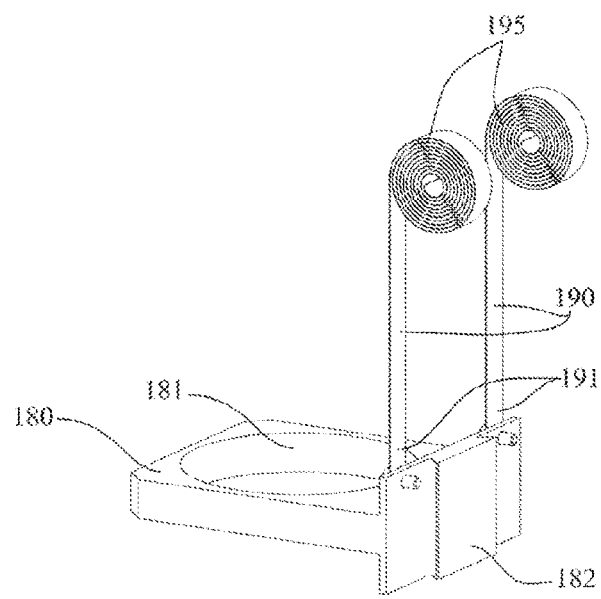
FIG. 6 shows a three-dimensional view of a holder and a height adjustment apparatus of the present application.

FIG. 6 shows a holder 180 and a height adjustment apparatus 190 in the apparatus for preventing solder paste dripping. As shown in FIG. 6, the apparatus for preventing solder paste dripping comprises the holder 180 and the height adjustment apparatus 190; one end of the height adjustment apparatus 190 is connected to the holder 180. As an example, the holder 180 is provided with a through-hole 181; the size of the through-hole 181 matches an outer diameter of the housing 710 of the solder paste tub 700.

As shown in FIGS. 1A and 1B, during use, the holder 180 is located above the working platform 150 for bearing the solder paste tub 700, and is connected to the housing 710 of the solder paste tub 700 by means of the through-hole 181 of the holder. One end of the holder 180 is slidably connected to a working platform support apparatus (i.e. the movable plate 140) for supporting the working platform 150, so that the holder 180 can move downward along with the solder paste tub 700 as the amount of solder paste in the solder paste tub 700 decreases, in order to adapt to the relative change in position of the solder paste nozzle 500 and the solder paste tub housing 710. It must be explained that although the working platform support apparatus connected to the holder 180 is the movable plate 140 in the embodiment shown in FIGS. 1A and 1B, an automatic solder paste addition apparatus which does not use a movable plate 140 may also use the apparatus provided in the present application for preventing solder paste dripping; in this case, the working platform support apparatus may be an immovable component, the only requirement being that this component is used to support the working platform 150. In other words, any automatic solder paste addition apparatus, as long as it uses an inverted solder paste tub for solder addition, can use the apparatus provided in the present application for preventing solder paste dripping, and during use, the holder 180 is connected to the working platform support apparatus for supporting the solder paste tub working platform.

Still as shown in FIGS. 1A and 1B, another end of the height adjustment apparatus 190 is connected, as the holder 180 is, to the movable plate 140, and used to adjust the height of the holder 180 relative to the movable plate 140. As an example, the height adjustment apparatus 190 is a flat spiral spring, comprising a free end 191 and a spiral roll part 195; the free end 191 of the flat spiral spring is connected to the holder 180, the spiral roll part 195 of the flat spiral spring is mounted on the movable plate 140, and the movable plate 140 is provided with a corresponding accommodating space 149 (see FIG. 2A) to accommodate the spiral roll part 195 of the flat spiral spring. The elasticity of the flat spiral spring should be matched to the weight of the solder paste accommodated in the solder paste tub 700. Specifically, the elasticity of the flat spiral spring must not be set too high, in order to prevent the solder paste tub 700 from being pulled off the solder paste nozzle 500, and must not be set too low, in order to avoid a situation where a sufficient pulling force to offset the weight of the solder paste cannot be applied to the solder paste tub 700. When the working process of solder addition shown in FIG. 5 is being performed, the flat spiral spring enables the holder 180 to move as the solder paste tub 700 is pressed to move downward. The height adjustment apparatus 190 may comprise two flat spiral springs, connected to two ends of the holder 180 respectively. The provision of two flat spiral springs enables the height of the holder 180 relative to the movable plate 140 to be adjusted more steadily. It must be noted that, as was the case with the holder 180, when the automatic solder paste addition apparatus 100 does not use a movable plate 140, the height adjustment apparatus 190 is connected to the working platform support apparatus supporting the working platform 150.

As shown in FIG. 6, the holder 180 comprises a slider 182 located on one side thereof. The slider 182 can fit a slide groove (such as the second slide groove 147 of the movable plate 140) disposed on the working platform support apparatus (such as the movable plate 140), so as to slidably connect the holder 180 to the working platform support apparatus (such as the movable plate 140). As an example, the slider 182 and the second slide groove 147 on the movable plate 140 have trapezoidal cross sections, and have matching dimensions, such that the slider 182 can be inserted into the second slide groove 147 from upper and lower ends of the second slide groove 147, and can slide up and down along the second slide groove 147 without being released from the second slide groove 147 in a direction transverse to the second slide groove 147.

FIGS. 7A and 7B show a three-dimensional view and an exploded view respectively of a solder paste tub of the present application. As shown in FIGS. 7A and 7B, the solder paste tub 700 comprises the housing 710 and a lid 720; the housing 710 has an outlet 712, and the lid 720 covers the outlet 712. Once solder paste has been packed into the housing 710, the lid 720 closes the outlet 712, to seal the solder paste in the housing 710.

An outer wall of the housing 710 is provided with an engagement means 750; when the solder paste tub 700 is inserted into the through-hole 181 of the holder 180 in an inverted manner (i. e. with the outlet 712 facing downward) (as shown in FIG. 1A), the engagement means 750 can mate with the through-hole 181 of the holder 180, so as to engage the solder paste tub 700 in the holder 180. As an example, the engagement means 750 is a limiting flange extending along a circumference of the outer wall of the housing 710. As an example, the engagement means 750 is disposed in a position close to the outlet 712, hence the engagement means 750 can mate with the lid 720 to seal the solder paste in the solder paste tub 700.

Figure 8A:
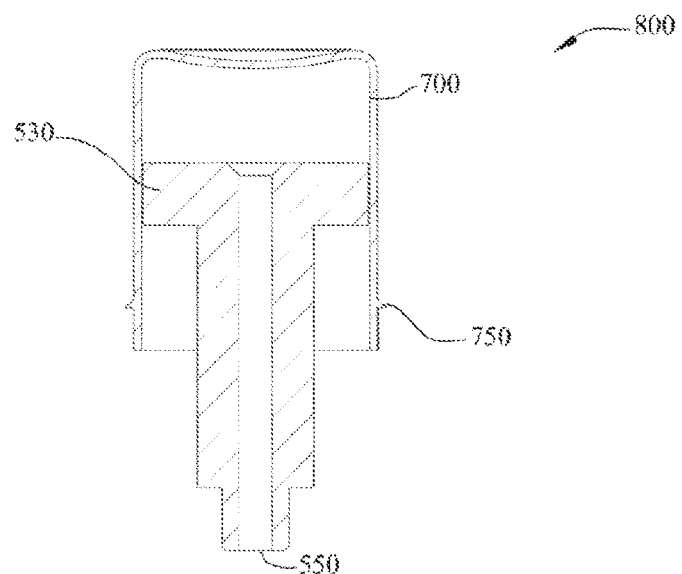
FIG. 8A shows a sectional view of a solder paste tub assembly of the present application.
Figure 8B:
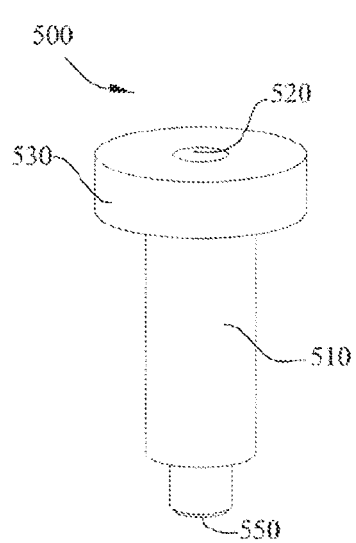
FIG. 8B shows a three-dimensional view of a nozzle in a solder paste tub assembly of the present application.

FIG. 8A shows a sectional view of a solder paste tub assembly 800 of the present application; FIG. 8B shows a three-dimensional view of the solder paste nozzle in the solder paste tub assembly of the present application. As shown in FIG. 8A, the solder paste tub assembly 800 of the present application comprises the solder paste tub 700 as shown in FIG. 7, solder paste accommodated in the solder paste tub 700, and the solder paste nozzle 500 (as shown in FIG. 8B) accommodated in the solder paste tub 700. The solder paste tub assembly 800 is mounted on the working platform 150 by means of the solder paste nozzle 500 (as shown in FIG. 1A).

As shown in FIG. 8B, the solder paste nozzle 500 has a nozzle main body 510, a nozzle hole 520 extending through the nozzle main body 510, an expanded head 530 located at one end of the nozzle main body 510 and a nozzle mouth 550 located at another end of the nozzle main body 510. As shown in FIG. 8A, a diameter of the expanded head 530 is matched to an inner diameter of the solder paste tub 700. An outer diameter of the nozzle main body 510 close to the nozzle mouth 550 may be set to be smaller, in order to mount the solder paste nozzle 500 in a solder paste through-hole 155 of the working platform 150 (as shown in FIG. 9B).

When the solder paste tub 700 accommodating the solder paste is used to form the solder paste tub assembly 800, first of all the lid 720 of the solder paste tub 700 is taken off the outlet 712, then the expanded head 530 of the solder paste nozzle 500 is inserted into the housing 710 through the outlet 712 of the solder paste tub 700. A vicinity of the outlet 712 in the solder paste tub 700 is not packed full of solder paste, but has a mounting space left for the solder paste nozzle 500.

When the solder paste tub assembly 800 is mounted on the working platform 150 in an inverted manner such that the opening 712 of the solder paste tub 700 is facing downward, with the solder paste nozzle 500 fixed and immobilized by the working platform 150, the housing 710 of the solder paste tub 700 can be moved downward relative to the solder paste nozzle 500 by the pressure plate 120 pressing the bottom of the solder paste tub 700, thereby distributing solder paste from the nozzle mouth 550 of the solder paste nozzle 500.

When the apparatus for preventing solder paste dripping and the solder paste tub 700 are fitted together, the amount of solder paste dripping from the solder paste nozzle mouth 550 or remaining at the nozzle mouth 550 due to the weight of the solder paste can be reduced.

Figure 8C:
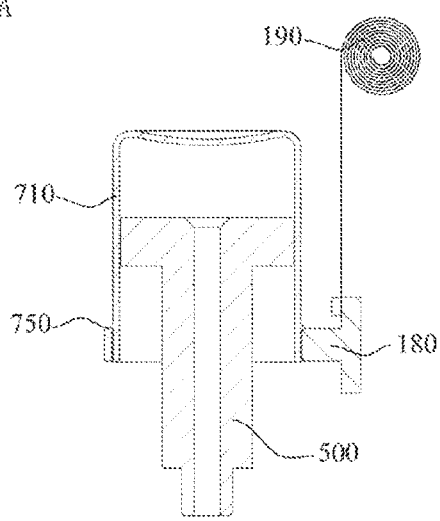
FIG. 8C shows a sectional view of an assembly for providing solder paste of the present application.

FIG. 8C shows a sectional view of an assembly for providing solder paste (a solder paste tub holding assembly) of the present application. As shown in FIG. 8C, the assembly for providing solder paste of the present application comprises the holder 180, the height adjustment apparatus 190 and the solder paste tub 700, etc., and is used to provide solder paste for the automatic solder paste addition apparatus. The assembly for providing solder paste of the present application utilizes the mating between the limiting flange 750 on the solder paste tub housing and the holder 180, can prevent dripping of solder paste due to its own weight when solder paste is being provided, and can thereby increase the utilization rate of solder paste and save costs; at the same time, the assembly for providing solder paste can prevent solder paste from dripping in unnecessary positions, to increase the production efficiency of products. A method for providing solder paste using the assembly for providing solder paste has already been described above, and is not repeated here.

Figure 9A:
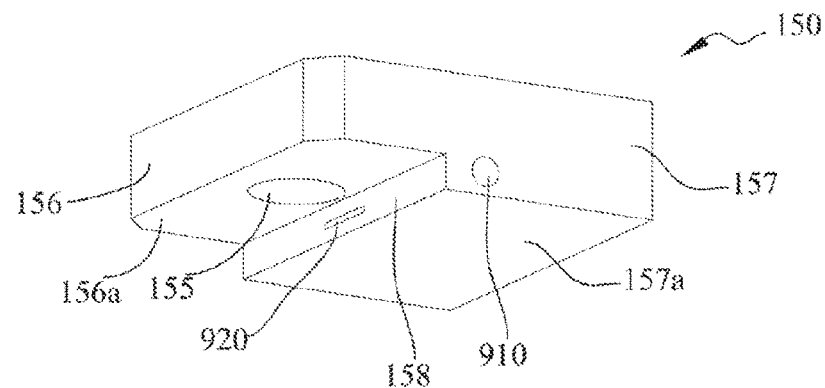
FIG. 9A shows a three-dimensional view of the working platform of the present application.
Figure 9B:
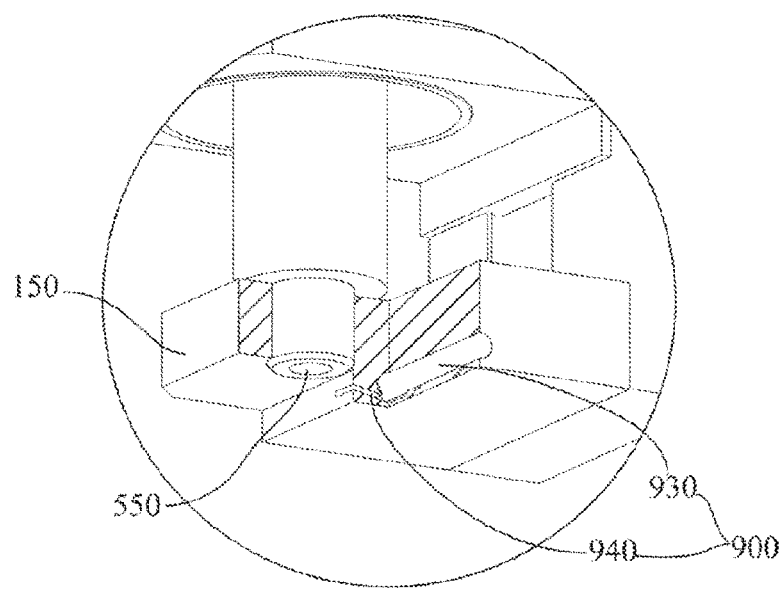
FIG. 9B is a partially sectional view of the working platform in FIG. 1A, showing a gas channel and a solder paste through-hole in the working platform.

FIG. 9A shows a three-dimensional view of the working platform 150 of the present application. FIG. 9B is a partially sectional and enlarged view of the working platform 150 in FIG. 1A, showing the positional relationship between a gas channel 900 and the solder paste through-hole 155 in the working platform 150. The present application also provides a means for automatically clearing away residual solder paste, comprising the gas channel 900 disposed in the working platform 150 (as shown in FIGS. 9A and 9B).

As shown in FIGS. 9A and 9B, the solder paste through-hole 155 and the gas channel 900 are provided in the working platform 150; the solder paste through-hole 155 is used to accommodate the solder paste nozzle mouth 550, and the gas channel 900 is used to guide a gas from inside a cleaning gas source (not shown) towards the solder paste nozzle mouth 550 accommodated in the solder paste through-hole 155, in order to cut (or clear away) residual solder paste at the solder paste nozzle mouth 550 by means of the gas.

Specifically, the working platform 150 comprises a first thick part 157 and a second thin part 156; a bottom surface 156a of the second thin part 156 is higher than a bottom surface 157a of the first thick part 157, so that a step surface 158 connected to the bottom surface 156a of the second thin part 156 is formed on the first thick part 157. The solder paste through-hole 155 extends through the second thin part 156, and the gas channel 900 is disposed in the first thick part 157. The gas channel 900 comprises a gas inlet 910 and a gas outlet 920; the gas inlet 910 is in communication with the cleaning gas source, and the gas outlet 920 is disposed on the step surface 158, so as to blow gas towards the solder paste nozzle mouth 550 accommodated in the solder paste through-hole 155. As an example, the gas outlet 920 is disposed close to the solder paste through-hole 155, to increase the cleaning efficiency of the cleaning gas.

The gas outlet 920 has a flat shape, so that cutting gas flowing out of the gas outlet 920 is formed as an air knife. The gas channel 900 comprises a first channel part 930 and a second channel part 940 in communication with each other; the first channel part 930 is connected to the cleaning gas source via the gas inlet 910, and the second channel part 940 is connected to the gas outlet 920. The second channel part 940 is narrower than the first channel part 930, so that gas flowing from the first channel part 930 to the second channel part 940 is accelerated, to form a sharper air knife at the gas outlet 920. In addition, the cleaning gas may be compressed gas, so as to increase the gas flow speed, and thereby help to make the air knife sharper.

Once the working process of solder addition has ended, i. e. once the pressure plate 120 has stopped pressing the solder paste tub 700, the apparatus for automatically clearing away residual solder paste immediately cuts off solder paste remaining at the solder paste nozzle mouth 550, and the residual solder paste thus cut off falls onto the stencil in a position where solder paste is present, thereby preventing solder paste remaining at the solder paste nozzle mouth 550 from dripping randomly onto the stencil in positions where solder paste does not need to be distributed, in the process of elevating the working platform 150 to the initial position or in the process of moving the entire automatic solder paste addition apparatus 100.

Examples are used herein to disclose the present application, and one or more of these examples are illustrated in the accompanying drawings. Every example is provided in order to explain the present application, not to limit it. In fact, it will be obvious to those skilled in the art that various amendments and modifications could be made to the present application without departing from the scope or spirit thereof. For example, an illustrated or described feature serving as a part of one embodiment could be used together with another embodiment, to obtain a further embodiment. Thus, the intention is that the present application shall encompass amendments and modifications made within the scope of the attached claims and their equivalents.

The invention claimed is:

1. A method for providing solder paste, for providing solder paste accommodated in a solder paste tub into a solder paste printer, the method comprising:

inserting a solder paste nozzle into a housing of the solder paste tub through an opening of the solder paste tub, wherein solder paste is accommodated in the housing of the solder paste tub;

bearing the solder paste tub, with the opening facing downward, on a working platform by the solder paste nozzle;

holding the solder paste tub by mating a holder with an engagement means on an outer wall of the housing of the solder paste tub, the holder being capable of moving up and down with the housing of the solder paste tub; and pressing the housing of the solder paste tub, such that the housing of the solder paste tub moves relative to the solder paste nozzle, at the same time causing the holder to move as the housing of the solder paste tub moves, so as to extrude solder paste accommodated in the housing of the solder paste tub from the solder paste nozzle, wherein a limiting flange on the housing of the solder paste tub configured to mate with a lid of the solder paste tub to seal the solder paste tub functions as the engagement means.

2. The method for providing solder paste as claimed in claim 1, wherein before the solder paste nozzle is inserted into the housing of the solder paste tub through the opening of the solder paste tub, the lid of the solder paste tub is removed from the opening of the solder paste tub, to expose the opening of the solder paste tub.

3. The method for providing solder paste as claimed in claim 1, wherein a height adjustment apparatus enables the holder to move up and down with the housing of the solder paste tub.

4. A method for providing solder paste, for providing solder paste accommodated in a solder paste tub into a solder paste printer, the method comprising:

inserting a solder paste nozzle into a housing of the solder paste tub through an opening of the solder paste tub, wherein solder paste is accommodated in the housing of the solder paste tub;

bearing the solder paste tub, with the opening facing downward, on a working platform by the solder paste nozzle;

holding the solder paste tub by mating a holder with an engagement means on an outer wall of the housing of the solder paste tub, the holder being capable of moving up and down with the housing of the solder paste tub; and pressing the housing of the solder paste tub, such that the housing of the solder paste tub moves relative to the solder paste nozzle, at the same time causing the holder to move as the housing of the solder paste tub moves, so as to extrude solder paste accommodated in the housing of the solder paste tub from the solder paste nozzle, wherein a height adjustment apparatus enables the holder to move up and down with the housing of the solder paste tub, and wherein the height adjustment apparatus comprises a flat spiral spring, with the elasticity of the flat spiral spring being configured to be matched to the weight of solder paste accommodated in the solder paste tub.

5. An assembly for providing solder paste, comprising:

a solder paste tub having a housing, with an engagement means being provided on an outer wall of the housing;

a holder, the holder being engaged with the housing of the solder paste tub by the engagement means, and thereby holding the solder paste tub, wherein the holder is slidably connected to a working platform support apparatus of an automatic solder paste addition apparatus, a working platform for bearing the solder paste tub is mounted on the working platform support apparatus, and the holder is located above the working platform, wherein the solder paste tub has an opening, the solder paste tub accommodates solder paste and a solder paste nozzle by the opening, the solder paste nozzle is mounted on the working platform so that the solder paste tub is borne, with the opening facing downward, on the working platform by the solder paste nozzle, and the housing can move relative to the solder paste nozzle, so as to extrude solder paste accommodated in the solder paste tub from the solder paste nozzle, wherein a height adjustment apparatus, with one end of the height adjustment apparatus being connected to the holder, and another end of the height adjustment apparatus being connected to the working platform support apparatus, for the purpose of adjusting the height of the holder relative to the working platform support apparatus, wherein the height adjustment apparatus is a flat spiral spring, with a free end of the flat spiral spring being connected to the holder, and a spiral roll part of the flat spiral spring being mounted on the working platform support apparatus, and wherein the elasticity of the flat spiral spring is configured to be matched to the weight of solder paste accommodated in the solder paste tub.

6. The assembly for providing solder paste as claimed in claim 5, characterized in that:

the engagement means is a limiting flange extending along a circumference of the outer wall of the housing.

7. The assembly for providing solder paste as claimed in claim 5, characterized in that:

the holder comprises a through-hole, with the size of the through-hole matching an outer diameter of the housing of the solder paste tub; and an edge of the through-hole of the holder is engaged below the engagement means.

8. The assembly for providing solder paste as claimed in claim 5, characterized in that:

the holder comprises a slider located on one side thereof, the working platform support apparatus comprises a slide groove located on one side thereof, and the slider fits the slide groove, so as to slidably connect the holder to the working platform support apparatus.

* * * * *